United States Patent
Yokoi et al.

(10) Patent No.: US 11,806,984 B2
(45) Date of Patent: Nov. 7, 2023

(54) SUPPLY UNIT, PRINTING DEVICE, AND METHOD FOR CONTROLLING PRINTING DEVICE

(71) Applicant: FUJI CORPORATION, Chiryu (JP)

(72) Inventors: Yoshimune Yokoi, Kiyosu (JP); Naoki Matsuzaki, Nishio (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/601,474

(22) PCT Filed: Apr. 26, 2019

(86) PCT No.: PCT/JP2019/017869
§ 371 (c)(1),
(2) Date: Oct. 5, 2021

(87) PCT Pub. No.: WO2020/217444
PCT Pub. Date: Oct. 29, 2020

(65) Prior Publication Data
US 2022/0203668 A1    Jun. 30, 2022

(51) Int. Cl.
*B41F 15/40* (2006.01)
*B41F 15/08* (2006.01)
*H05K 3/12* (2006.01)

(52) U.S. Cl.
CPC .............. *B41F 15/40* (2013.01); *B41F 15/08* (2013.01); *H05K 3/1233* (2013.01)

(58) Field of Classification Search
CPC ........ B41F 15/08; B41F 15/40; H05K 3/1233
See application file for complete search history.

(56) References Cited

U.S. PATENT DOCUMENTS

2019/0337287 A1    11/2019  Fukakusa et al.

FOREIGN PATENT DOCUMENTS

| JP | 3880850 B2 | * | 2/2007 |
| JP | WO2018096607 | * | 5/2018 |
| JP | 2018-118407 A | | 8/2018 |

(Continued)

OTHER PUBLICATIONS

International Search Report dated Jun. 11, 2019 in PCT/JP2019/017869 filed on Apr. 26, 2019, 2 pages.

*Primary Examiner* — Christopher E Mahoney
*Assistant Examiner* — Marissa Ferguson-Samreth
(74) *Attorney, Agent, or Firm* — Oblon, McClelland, Maier & Neustadt, L.L.P.

(57) ABSTRACT

The supply unit is used in a printing device including a printing head configured to perform printing process of a viscous fluid on a printing target using a screen mask, a collection section having a collection member configured to contact the screen mask to collect and move the viscous fluid and a collecting and moving section configured to move the collection member in a predetermined printing direction. The supply unit includes a supply section having a mounting section capable of mounting and dismounting a cartridge accommodating the viscous fluid, a driving section configured to move the supply section in the supply operation direction, a detection member, and a supply section detecting section configured to detect whether the supply section is positioned in a passage space where the collection section and the supply section do not contact each other by the position of the detection member.

9 Claims, 10 Drawing Sheets

(56) References Cited

FOREIGN PATENT DOCUMENTS

| JP | 2018118407 A | * | 8/2018 | |
| WO | WO-2013124942 A1 | * | 8/2013 | .............. B41F 15/08 |
| WO | WO 2018/096607 A1 | | 5/2018 | |

* cited by examiner

SUPPLY UNIT, PRINTING DEVICE, AND METHOD FOR CONTROLLING PRINTING DEVICE

TECHNICAL FIELD

The present specification discloses a supply unit, a printing device, and a control method of the printing device.

BACKGROUND ART

Conventionally, in a printing device configured to perform printing process of a viscous fluid such as solder on a printing target such as a board using a screen mask, it has been proposed to provide a collecting plate, move the collecting plate behind the squeegee after the squeegee exceeds a tail end of a printing area of the mask, and collect the cream solder (refer to Patent Literature 1, for example). In this printing device, the cream solder can be collected and moved to the distal end of the printing area, so that one-way printing of multiple boards can be performed. In addition, in a printing device, a device including a supply device for supplying cream solder and automatically supplying cream solder to a mask has been proposed (refer to Patent Literature 2, for example).

PATENT LITERATURE

Patent Literature 1: International Publication No. 2018/096607
Patent Literature 2: JP-A-2018-118407

BRIEF SUMMARY

Technical Problem

However, in the above-described printing device, it has not been assumed that both the collecting plate and the supplying device are provided. Since the collecting plate and the supply device operate in a common work region, there could be a problem that the members interfere with each other.

The present disclosure has been made in view of such problems, and it is a principal object thereof to provide a supply unit, a printing device, and a control method of the printing device capable of preventing interference between members.

Solution to Problem

The supply unit, the printing device, and the control method of the printing device disclosed in the present specification adopt the following means in order to achieve the main object described above.

That is, the supply unit of the present disclosure is used in a printing device including, a printing head configured to perform printing process of a viscous fluid to a printing target using a screen mask and a collection section having a collection member configured to contact the screen mask to collect and move the viscous fluid and a collection moving section configured to move the collection member in a predetermined printing direction, wherein the supply unit includes a supply section having a mounting section capable of mounting and dismounting a cartridge accommodating the viscous fluid, a driving section configured to move the supply section in a supply operation direction, a detection member, and a supply section detecting section configured to detect whether the supply section is positioned in a passage space where the collection section and the supply section do not contact each other by a position of the detection member.

In this supply unit, it is detected by the position of the detection member whether the supply section is positioned in the passage space where the collection section and the supply section do not contact each other. Therefore, in this supply unit, it is possible to allow the supply section to work in a passage space where no physical interference occurs when operating the collection section. Accordingly, it is possible to prevent interference between the members of the collection section and the supply section. Herein, examples of the "printing target" include, but not limited to, a board, on which a component is mounted, and a three-dimensional object. In addition, examples of the "viscous fluid" include, but not limited to, solder paste, conductive paste, and adhesive.

DESCRIPTION OF EMBODIMENTS

Figure 1:
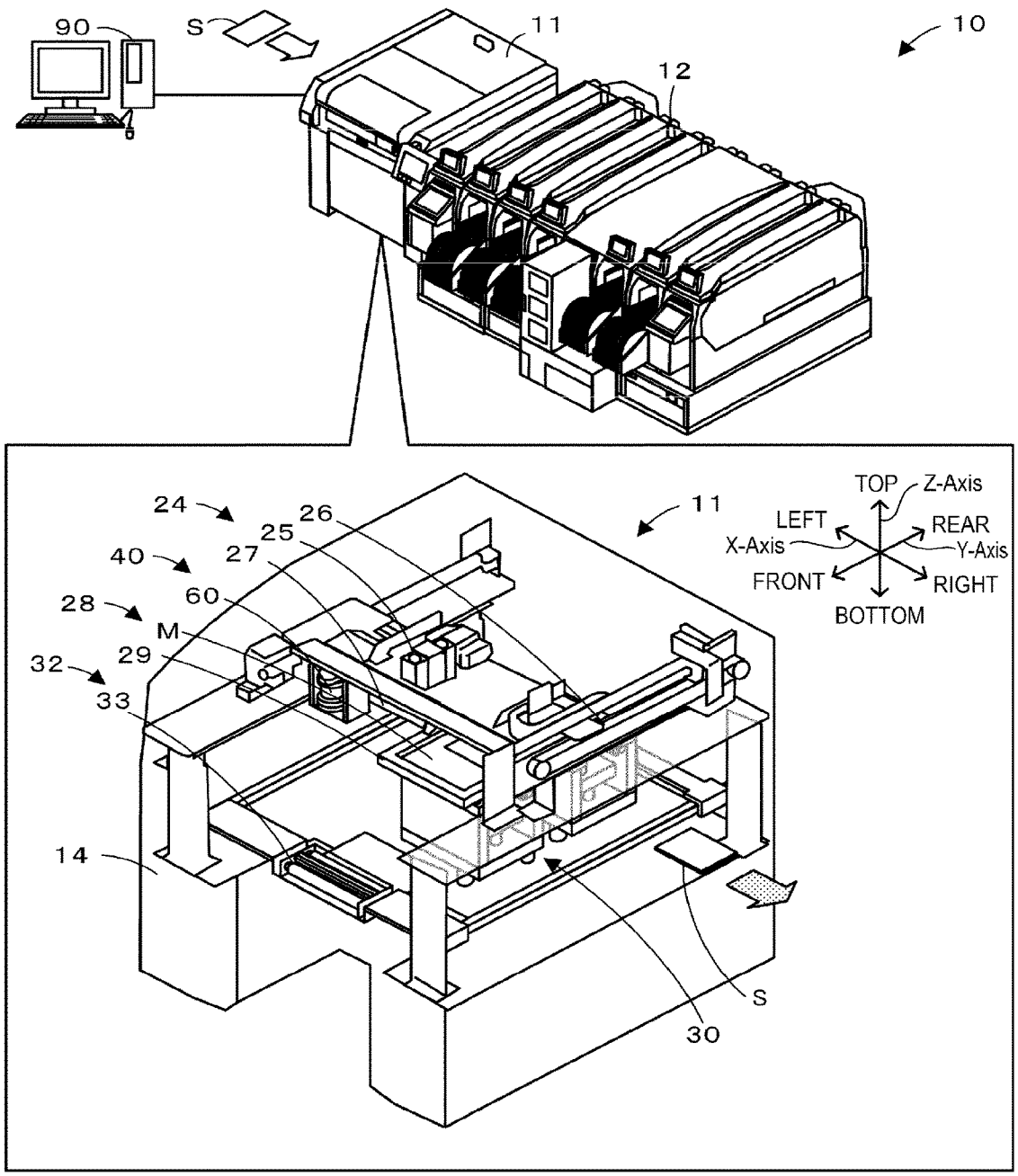
FIG. 1 is a schematic explanatory view showing an example of mounting system 10.
Figure 2:
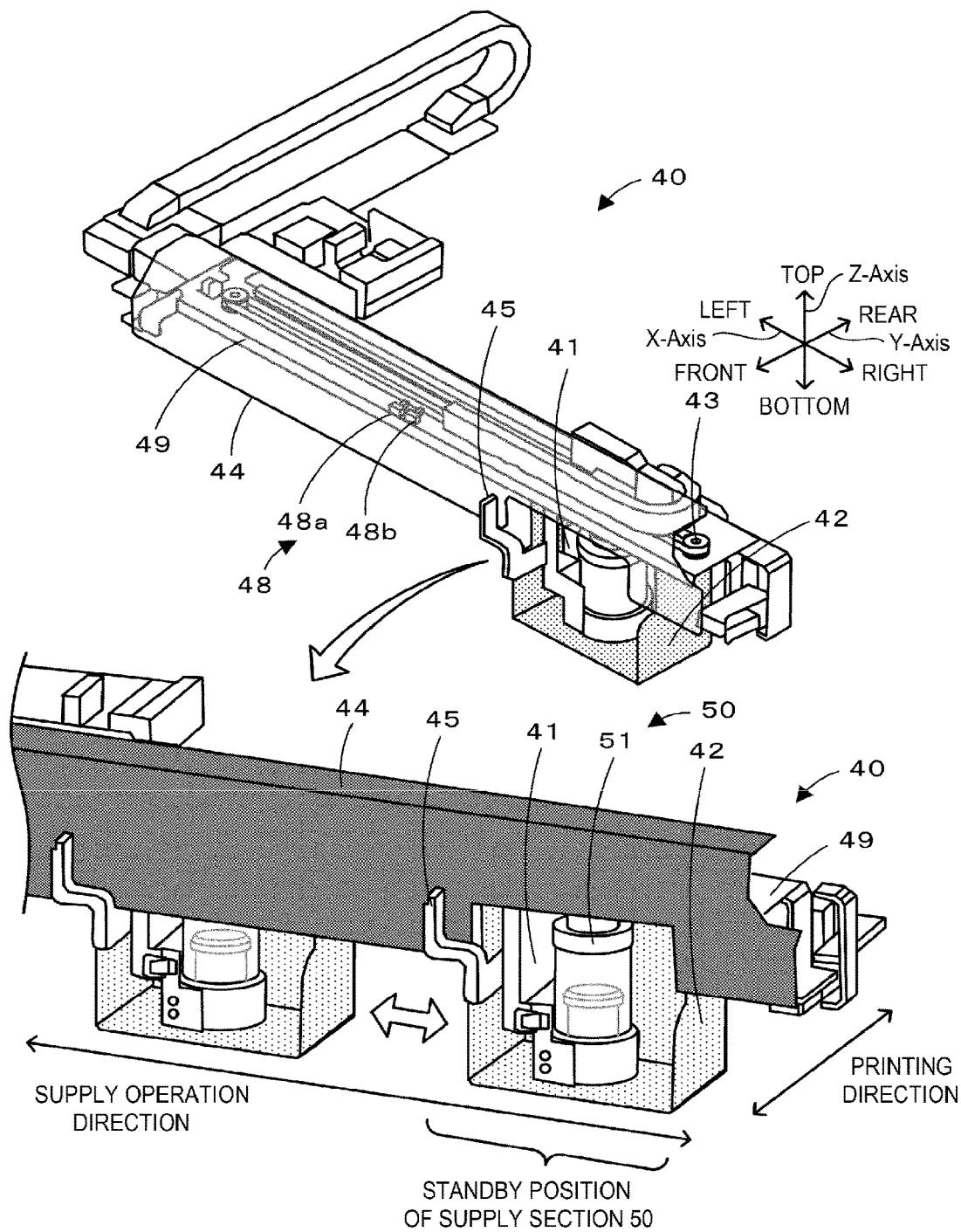
FIG. 2 is an explanatory view of supply unit 40.
Figure 3:
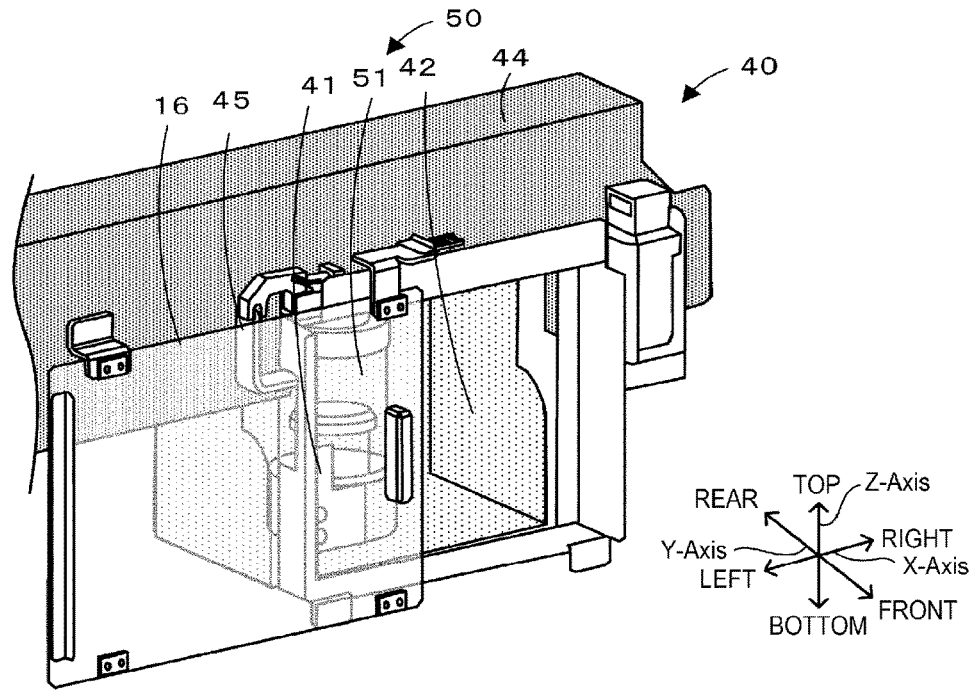
FIG. 3 is an explanatory view of supply section 50 in a standby position.
Figure 4:
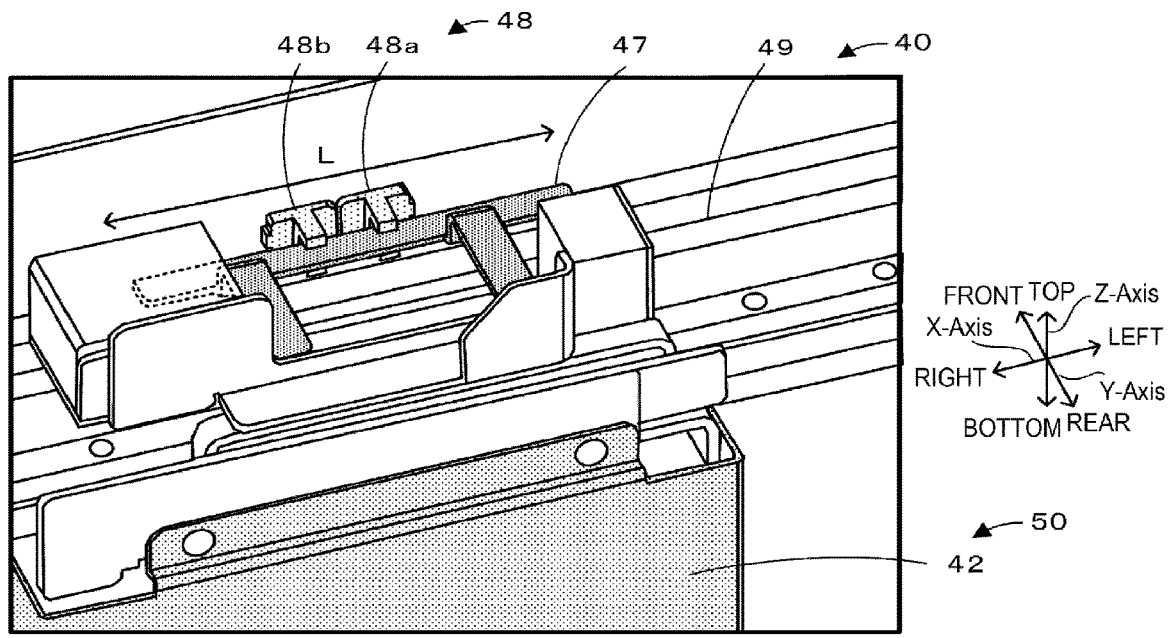
FIG. 4 is an explanatory view of detection member 47 and supply section detecting section 48.
Figure 5:
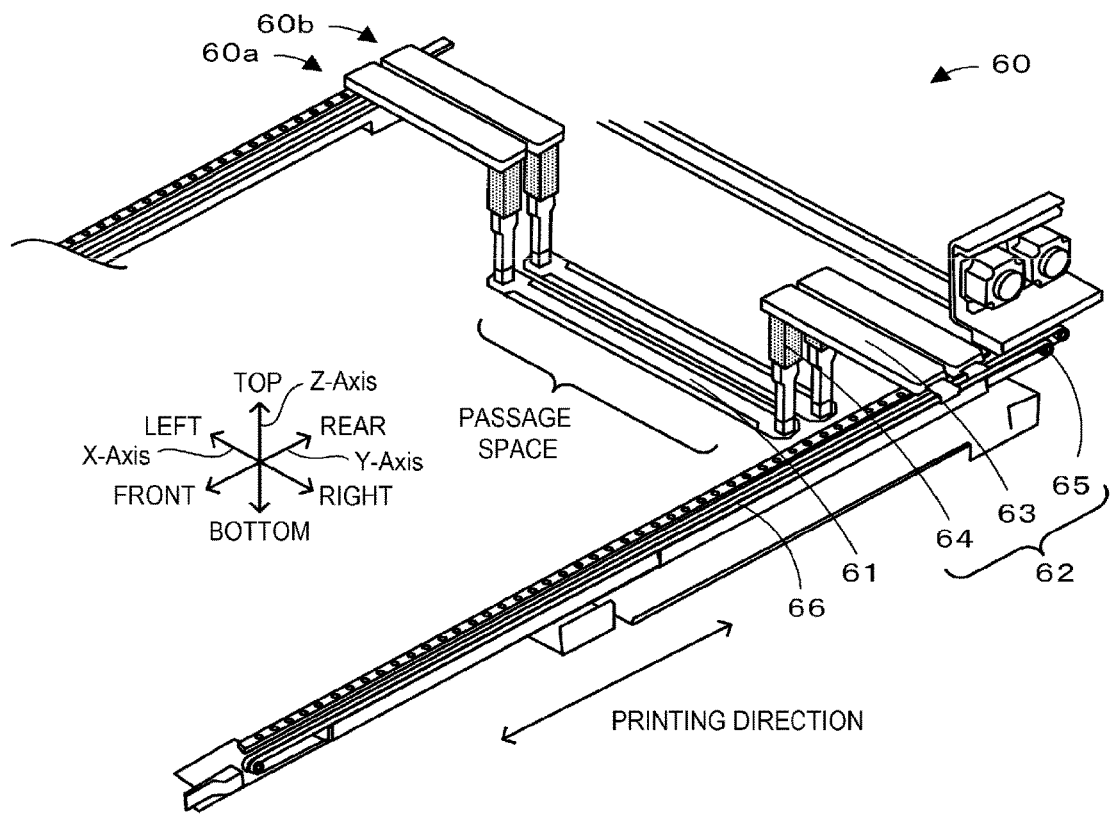
FIG. 5 is a perspective view of collection section 60.
Figure 6A:
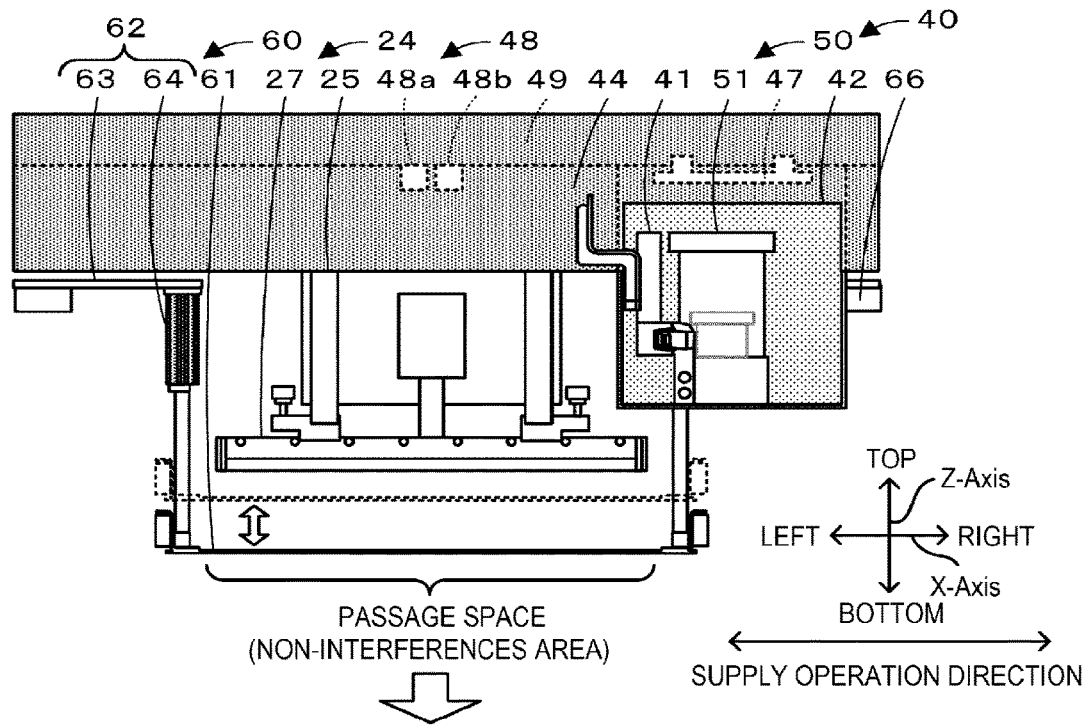
FIG. 6 is an explanatory view of printing section 24, supply unit 40, and collection section 60 as viewed from the front face.
Figure 6B:
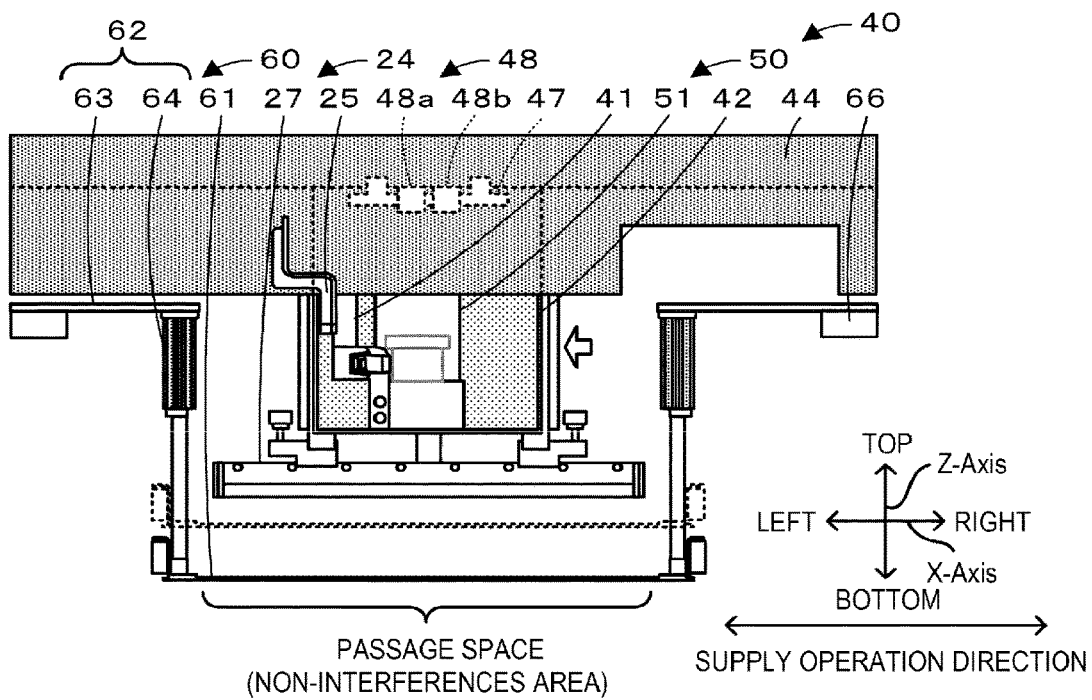
Figure 7:
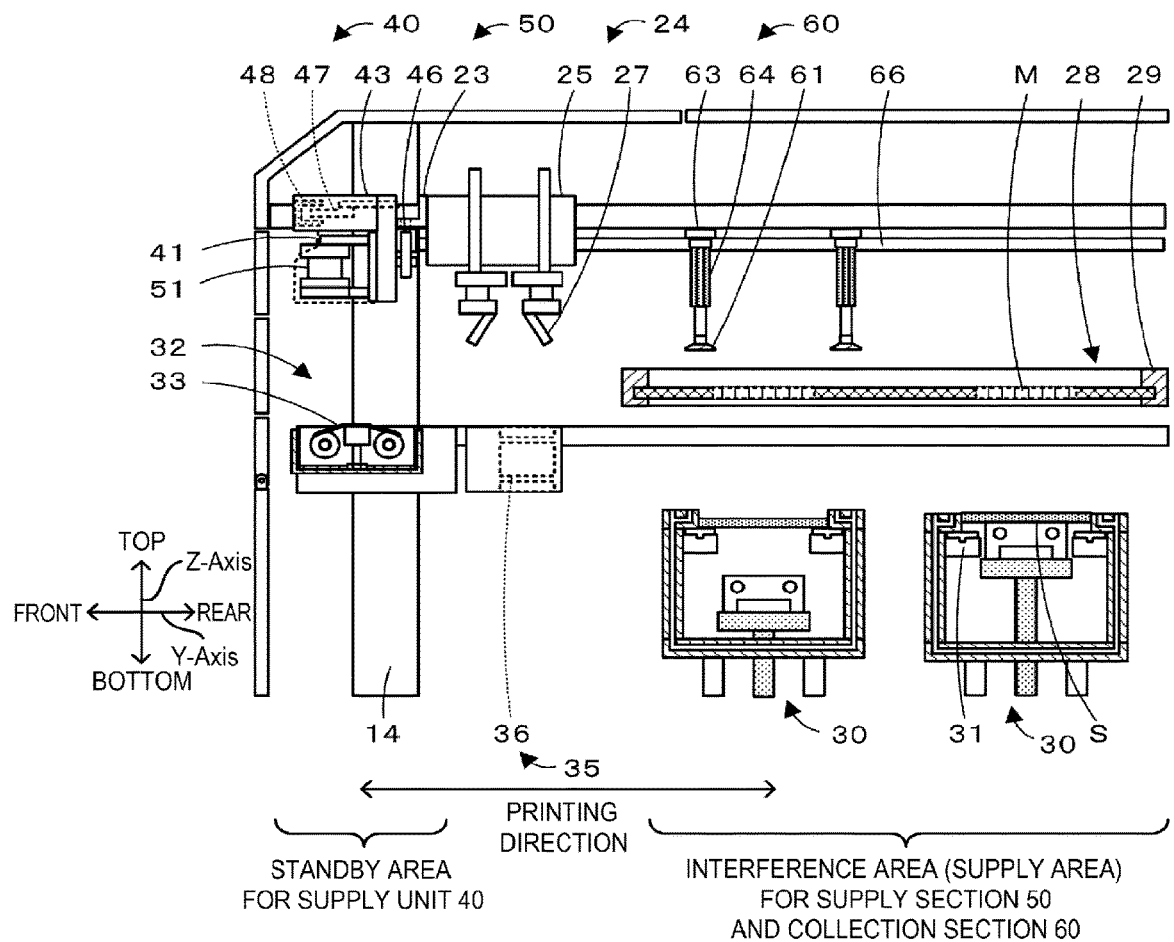
FIG. 7 is an explanatory view of printing section 24, supply unit 40, and collection section 60 as viewed from the side surface.
Figure 8:
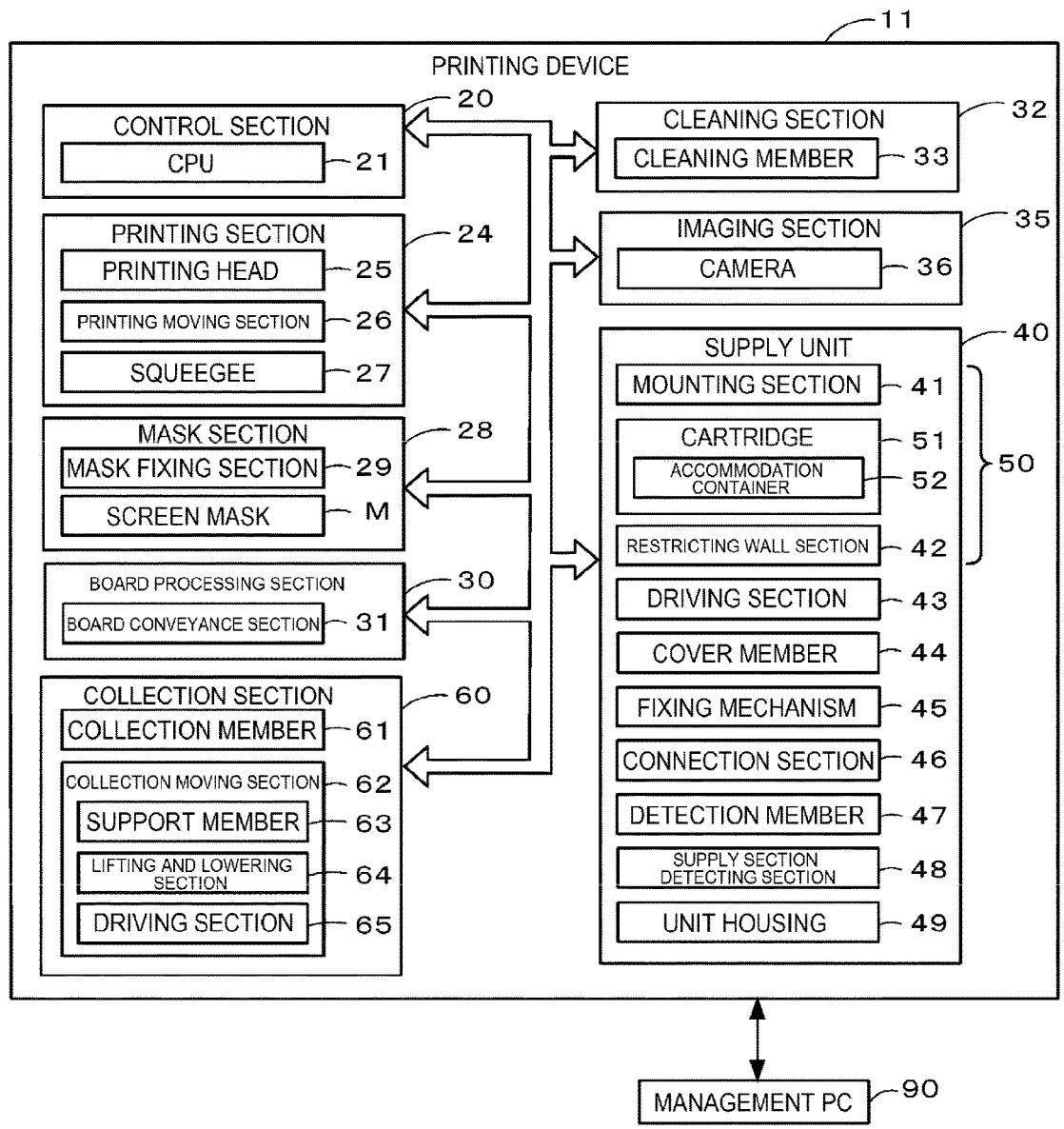
FIG. 8 is a block diagram illustrating an electrical connection relationship of printing device 11.

The present embodiment will be described below with reference to the drawings. FIG. 1 is a schematic explanatory view showing an example of mounting system 10 including printing device 11 which is an example of the present disclosure. FIG. 2 is an explanatory view of supply unit 40. FIG. 3 is an explanatory view of supply section 50 in the standby position. FIG. 4 is an explanatory view of detection member 47 and supply section detecting section 48. FIG. 5 is a perspective view of collection section 60. FIG. 6 is an explanatory view of printing section 24, supply unit 40, and collection section 60 as viewed from the front face, FIG. 6A is a view in which supply section 50 is in the standby position, and FIG. 6B is a view in which supply section 50 is in the passage space. FIG. 7 is an explanatory view of printing section 24, supply unit 40, and collection section 60 as viewed from the side surface. FIG. 8 is a block diagram illustrating an electrical connection relationship of printing device 11. Mounting system 10 is, for example, a system for mounting a component on board S. Mounting system 10 includes printing device 11, mounting device 12, and management computer (PC) 90. Mounting system 10 is configured as a mounting line in which multiple mounting devices 12 configured to mount components on board S are disposed on a downstream side of printing device 11. In the present embodiment, the left-right direction (the X-axis), the front-rear direction (the Y-axis), and the up-down direction (the Z-axis) are as illustrated in FIGS. 1 to 7 and 11.

Mounting device 12 is a device that mounts a component on board S, on which viscous fluid such as solder paste is printed by printing device 11. Management PC 90 is a device for managing information of each device of mounting system 10. Management PC 90 manages the progress status of each device on the mounting line. Each device of mounting system 10 exchanges information with management PC 90 to obtain information such as the progress status of other devices.

Printing device 11 is a device for applying (printing) a solder paste as a viscous fluid to board S as the printing target below via a pattern hole formed in screen mask M by pushing the solder paste on screen mask M into the pattern hole formed in screen mask M using squeegee 27. Examples of the "printing target" include board S, on which a component is mounted, and a three-dimensional object, or the like. Examples of the "viscous fluid" include solder paste, conductive paste, and adhesive. Here, board S and solder paste are used as examples for the following explanation. Printing device 11 includes main body 14, control section 20 (refer to FIG. 8), printing section 24, mask section 28, board processing section 30, cleaning section 32, imaging section 35, supply unit 40 serving as a supply section, and collection section 60. Control section 20 is configured as a microprocessor mainly including CPU 21, and controls entire printing device 11.

Printing section 24 is disposed in an upper stage of printing device 11, and is a unit configured to perform printing process of a viscous fluid on board S using screen mask M. Printing section 24 includes printing head 25, printing moving section 26, squeegee lifting and lowering section, and squeegee 27. Printing moving section 26 moves printing head 25 in a predetermined printing direction (here, the front-rear direction), and includes a slider configured to move along a guide formed in the front-rear direction and a motor configured to drive the slider. Printing moving section 26 has a linear encoder (not illustrated) and can grasp the position of printing head 25. Squeegee 27 is disposed on the lower surface side of printing head 25 and is lifted and lowered by a squeegee lifting and lowering section. Printing section 24 has two squeegees 27 used in the front-rear direction. Printing section 24 can be connected to and disconnected from supply unit 40, and printing moving section 26 moves supply unit 40 along with printing head 25. Supply unit 40 does not have a moving section such as a motor, but is coupled to printing section 24 by connection section 46, and moves in the front-rear direction between the supply area and the standby area by printing moving section 26 (refer to FIG. 7). Engagement member 23 is a member coupled to supply unit 40 by connection section 46 provided supply unit 40 (refer to FIG. 7). Engagement member 23 is provided with an insertion hole into which a fixing rod of connection section 46 is inserted.

Mask section 28 is disposed between printing section 24 and board processing section 30 in the up-down direction, and is a unit that fixedly holds screen mask M. Mask section 28 includes mask fixing section 29. Mask fixing section 29 positions and supports and fixes screen mask M in a horizontal posture. Board processing section 30 is a unit disposed below mask section 28, for carrying in board S, positioning and supporting carried-in board S, and contacting and separating board S with screen mask M. Board processing section 30 includes board conveyance section 31 configured to convey board S in the left-right direction, a board supporting member that supports board S from below, and a support lifting and lowering section that lifts and lowers entire board processing section 30 and the board supporting member. In printing device 11, board processing section 30 for conveying and fixing board S is provided in two lanes. Cleaning section 32 is disposed between mask section 28 and board processing section 30 in the up-down direction, and is a unit that performs cleaning processing for cleaning the bottom surface of screen mask M by cleaning member 33. Examples of cleaning member 33 include cleaning paper. Imaging section 35 includes camera 36 configured to pick up images of board S and screen mask M. Control section 20 performs, for example, position alignment between screen mask M and board S based on the captured image.

Supply unit 40 is a unit that is movably disposed above mask section 28 and at the same height as printing section 24, and supplies the solder paste accommodated in cartridge 51 onto screen mask M. Accommodation container 52 accommodating solder paste is disposed in cartridge 51, so that the solder paste is discharged to the outside by supplying pressurized air. Supply unit 40 is disposed in front of printing head 25 (refer to FIG. 7). As illustrated in FIG. 2, supply unit 40 includes mounting section 41, restricting wall section 42, driving section 43, cover member 44, fixing mechanism 45, supply section detecting section 48, and detection member 47 (refer to FIG. 4). Mounting section 41, restricting wall section 42, and cartridge 51 constitute supply section 50 moved by driving section 43. Supply section 50 is disposed below unit housing 49 formed in the left-right direction of the device, and moves in the supply operation direction (the left-right direction) by driving section 43 disposed in unit housing 49. Mounting section 41 is configured to mount and dismount cartridge 51. A snap lock having a hook and a pivoting lever is disposed on cartridge 51, and cartridge 51 is attached to and fixed to mounting section 41 by the snap lock. Restricting wall section 42 is a wall member configured to cover cartridge 51 and to regulate access to the inside of printing device 11. This restricting wall section 42 is a member configured to prevent a part of the operator's body or some member from entering the device having a configuration to operate when door member 16 is opened. Driving section 43 moves cartridge 51 mounted on mounting section 41 in the supply operation direction along with restricting wall section 42. Driving section 43 includes a driving roller to which a motor is connected, a driven roller, and a belt spanned between the driving roller and the driven roller in the left-right direction. Mounting section 41 and restricting wall section 42 are fixed to the belt, and mounting section 41 and restricting wall section 42 move in the supply operation direction by the driving of the belt. Cover member 44 is a member configured to cover a front section and an upward section of unit housing 49, and is a member configured to protect driving section 43 and the like. Fixing mechanism 45 is a mechanism for fixing supply section 50 in the standby position, and is configured by a fixing stay and a hook member engaged with a distal end of the fixing stay (refer to FIG. 3). Connection section 46 connects and disconnects supply unit 40 and printing section 24 (printing moving section 26), and has a fixing rod and an air cylinder that moves the fixing rod up and down (refer to FIG. 7).

As illustrated in FIG. 4, detection member 47 is a plate-like member having a longitudinal direction in the supply operation direction. Detection member 47 is disposed at an upper center of supply section 50 configured to move in the supply operation direction and to move in the supply operation direction along with supply section 50. Detection member 47, by being detected by supply section detecting section 48, is a member used to detect that supply section 50 is present in a predetermined non-interferences area (in the passage space) in the supply operation direction. This detection member is formed to have a length L in the supply operation direction so that supply section 50 moves in a range in which supply section 50 does not contact collection section 60 (refer to FIGS. 5 to 8 and FIG. 11). Supply section detecting section 48 is a non-contact sensor in which a sensing space through which detection member 47 passes is formed. Supply section detecting section 48 is disposed in unit housing 49 as a fixing member configured not to move in the supply operation direction. Supply section detecting section 48 outputs a signal when detection member 47 is present in the sensing space. Supply section detecting section 48 has two sensors, detection sensor 48a and detection sensor 48b. This supply section detecting section 48 is a sensor configured to sense, based on the position of detection member 47, whether supply section 50 is positioned in a passage space where collection section 60 and supply section 50 do not contact each other, as will be described in detail later. Supply section detecting section 48 is disposed at a predetermined position of unit housing 49 corresponding to the center of collection member 61 or the center of the passage space. Supply section detecting section 48 outputs a signal only from detection sensor 48b, for example, when detection member 47 is on the right side in FIG. 4 and the left end section of detection member 47 deviates from detection sensor 48a. Similarly, in supply section detecting section 48, when detection member 47 is on the left side in FIG. 4 and the right end section of detection member 47 deviates detection sensor 48b, a signal is output only from detection sensor 48a. In addition, when detection member 47 deviates from supply section detecting section 48, no signal is output, and when detection member 47 is present in the sensing spaces of detection sensors 48a and 48b, signals are output from both sensors. As described above, supply section detecting section 48 can approximately grasp the position and state of supply section 50 based on the output signals from the two detection sensors 48a and 48b.

Collection section 60 is a unit that collects the solder roll remaining on screen mask M on collection member 61 by squeegee 27. Printing device 11 has two collection sections 60a and 60b, and is compatible with one-way printing or dual lane printing. Here, collection sections 60a and 60b are collectively referred to as collection section 60. Collection section 60 has collection member 61 and collecting and moving section 62. Collection member 61 is a member configured to contact screen mask M, to place a solder roll, and to collect and move the solder roll. Collection member 61 is a thin plate-like member whose longitudinal direction is the supply operation direction, and tapered surfaces are formed on both sides in the printing direction so as to facilitate the transfer of the solder roll with screen mask M (refer to FIG. 5). Collecting and moving section 62 supports collection member 61 and moves collection member 61 in a predetermined printing direction (front-rear direction). Collecting and moving section 62 has a support member 63, a lifting and lowering section 64, and driving section 65. Supporting member 63 is a member configured to move along guide 66 formed in the printing direction, and to support lifting and lowering section 64. Lifting and lowering section 64 is a columnar member, and an air cylinder is formed in the interior thereof. An upper end of lifting and lowering section 64 is fixed to supporting member 63, and a supporting rod to which collection member 61 is fixed is inserted into a lower end side of lifting and lowering section 64. Pressurized air (not illustrated) is supplied to the lifting and lowering section 64, so that collection member 61 is moved up and down by lifting and lowering the supporting rod. Driving section 65 includes a driving roller to which a motor is connected, a driven roller, and a belt spanned between the driving roller and the driven roller in the front-rear direction. Supporting member 63 is fixed to the belt, and supporting member 63 is moved in the printing direction by the driving of the belt. A linear encoder (not illustrated) is formed along guide 66 in collection section 60 so that the position of collection member 61 in the printing direction can be grasped. Although not illustrated, collection section 60 is disposed with an origin sensor for detecting the origin of collection section 60, a contact prevention sensor for preventing contact between collection sections 60a and 60b, an end sensor for detecting that collection section 60 has reached an end section of the movement range, and the like.

Here, the positional relationship among printing section 24, supply unit 40, and collection section 60 will be described. As illustrated in FIG. 6, squeegee 27 of printing section 24 is formed to be shorter than the lateral width of collection member 61, so that even if the operation of overtaking collection member 61 is performed in the lifted position, there will be no interference (contact) with collection section 60. On the other hand, as illustrated in FIG. 6A, when supply section 50 moves rearward in a state in which cartridge 51 is in a standby position where replacement is possible, it contacts supporting member 63 of collecting and moving section 62, lifting and lowering section 64 and the supporting rod, and the like. On the other hand, as illustrated in FIG. 6B, supply section 50 does not contact collection section 60 regardless of the height of collection member 61 when it is in the passage space formed between collecting and moving sections 62. Since supply unit 40 and collection section 60 perform works in an interference area where supply section 50 and collection section 60 may interfere with each other above screen mask M, for example, as illustrated in FIG. 7, and in a supply area where the solder paste is supplied from supply section 50, there arises a problem that they contact each other when they are operated without limitation. In printing device 11, although the details will be described later, supply section 50 is controlled using detection member 47 and supply section detecting section 48 so that supply section 50 and collection section 60 do not contact each other.

Figure 9:
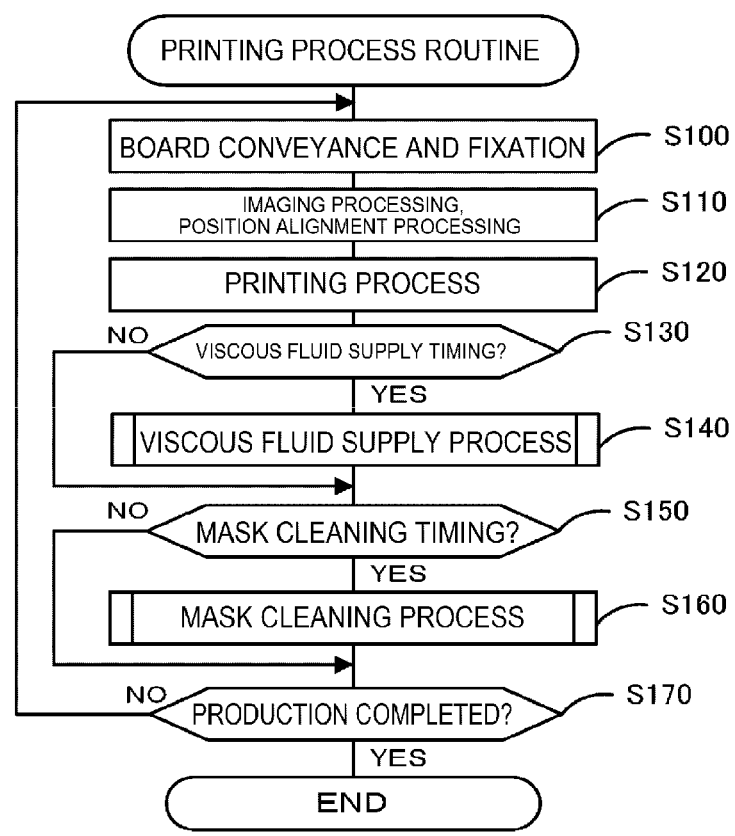
FIG. 9 is a flowchart illustrating an example of a printing process routine.

Next, the operation of printing device 11 configured as described above, first, the operation of the printing process will be described. FIG. 9 is a flowchart illustrating an example of a printing process routine executed by CPU 21 of control section 20. This routine is stored in the storage section of control section 20 and executed in accordance with an input of the operator to initiate the printing process. When this routine is executed, CPU 21 causes board processing section 30 to convey and fix board S (S100), causes imaging section 35 to read the reference marks of board S and screen mask M to perform the position alignment of board S and screen mask M (S110), and causes printing section 24 to execute printing process (S120). In the printing process, printing head 25 is moved, and a viscous fluid (here, solder paste) is supplied onto board S disposed on the lower surface of screen mask M by squeegee 27. At this time, when the viscous fluid (solder roll) on screen mask M after the previous printing process is not at the present printing start position, CPU 21 places the viscous fluid on collection member 61 of collection section 60, moves the viscous fluid to the printing start position by collecting moving section 62, and then executes printing with squeegee 27. Board S subjected to the printing process is conveyed to the next device by board processing section 30. Next, CPU 21 determines whether it is a timing to supply the viscous fluid (S130). This determination can be made, for example, based on whether a predetermined supply time has elapsed for the printing process time. This determination can also be made by detecting the size (amount) of the viscous fluid on screen mask M. When it is a timing to supply the viscous fluid in S 130, CPU 21 executes supplying process of viscous fluid (S 140). After S 140 or when it is determined in S 130 that the supply timing of the viscous fluid is not reached, CPU 21 determines whether the cleaning timing of screen mask M is reached (S 150). This determination can be made, for example, based on whether the printing process time has elapsed a predetermined cleaning time. When it is a timing to clean screen mask M, cleaning section 32 performs the cleaning process of screen mask M (S160). After S 160 or when it is not a timing to clean screen mask M in S 150, CPU 21 determines whether the production processing of board S is completed (S170), and executes the processing in and after S100 when the production processing of board S is not completed. On the other hand, when the production processing of board S is completed in S 170, the routine is finished.

Figure 10:
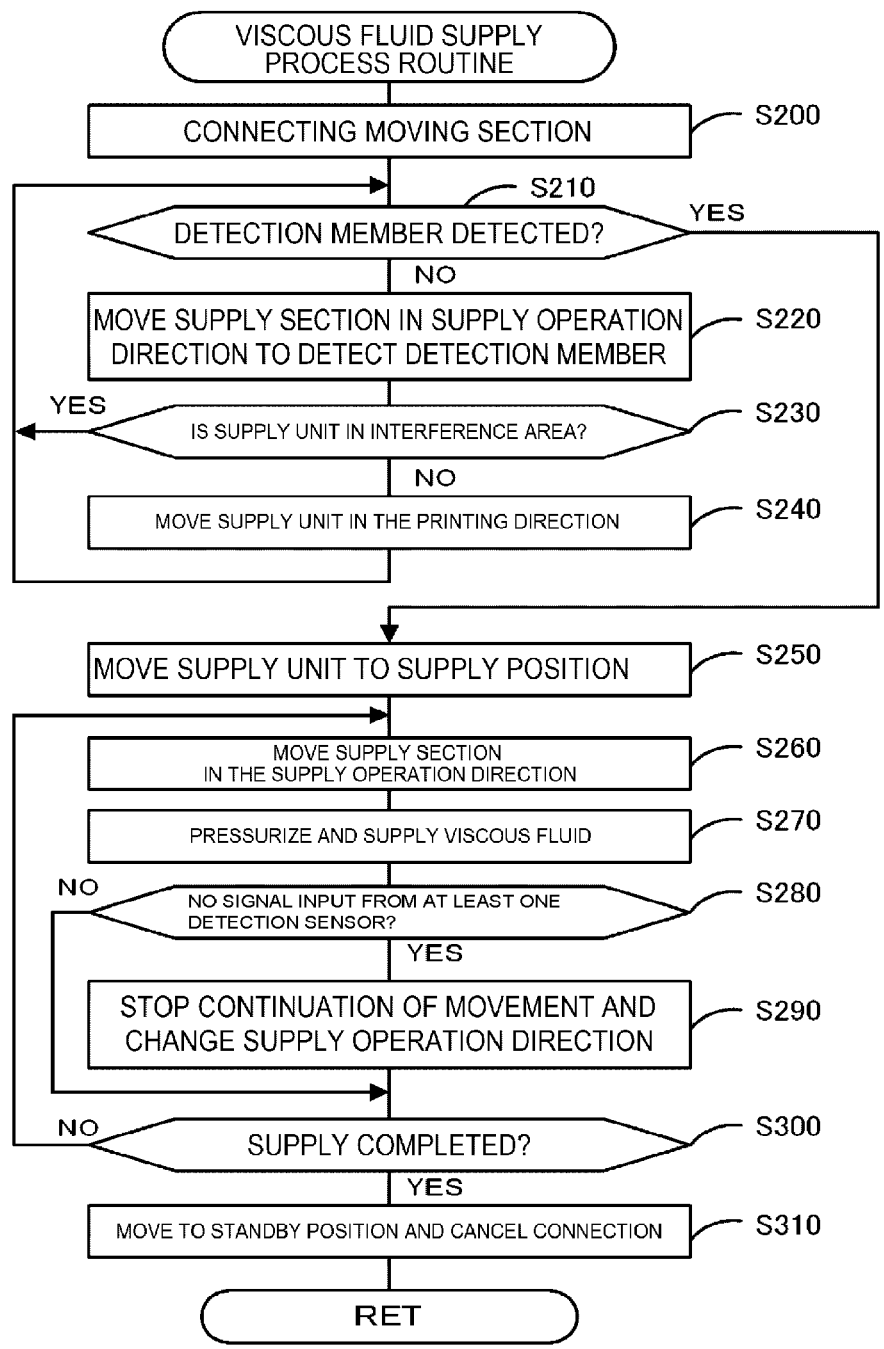
FIG. 10 is a flowchart illustrating an example of a viscous fluid supply processing routine.

Next, an operation of the supply processing by supply unit 40 in S 140 will be described. FIG. 10 is a flowchart illustrating an example of a viscous fluid supply processing routine executed by CPU 21 of control section 20. This routine is stored in the storage section of control section 20, and executed in S140 of the printing process routine. When this routine is executed, CPU 21 couples printing section 24 to supply unit 40 (S200), and determines whether supply section detecting section 48 has detected detection member 47 based on the signal inputted from supply section detecting section 48 (S210). When detection member 47 is not detected, CPU 21 causes driving section 43 to move supply section 50 in the supply operation direction so that the supply section detecting section 48 detects detection member 47 (S220). When supply section 50 is in the standby position as the initial position, CPU 21 moves supply section 50 toward the center where supply section detecting section 48 is disposed, based on the value of the linear encoder of driving section 43. Next, CPU 21 determines whether supply unit 40 is in an interference area (refer to FIG. 7) that interferes with collection section 60, based on the value of the linear encoder of printing moving section 26 (S230). When supply unit 40 is not in the interference area, since supply section 50 and collection section 60 do not interfere with each other, CPU 21 causes printing moving section 26 to move supply unit 40 toward the supply area along the printing direction (S240), and executes the processing in and after S210. That is, since supply section 50 does not contact collection section 60 until supply unit 40 reaches the interference area, CPU 21 causes supply section 50 to skew to shorten the movement time of supply section 50.

Figure 11A:
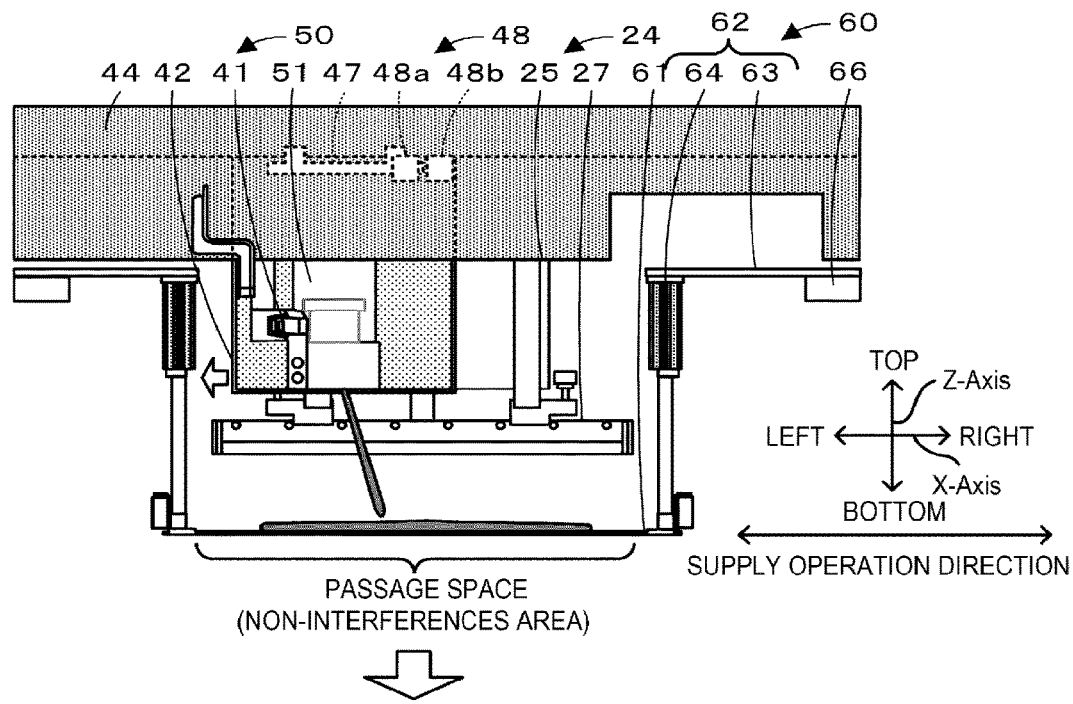
FIG. 11 is an explanatory diagram of supply processing.
Figure 11B:
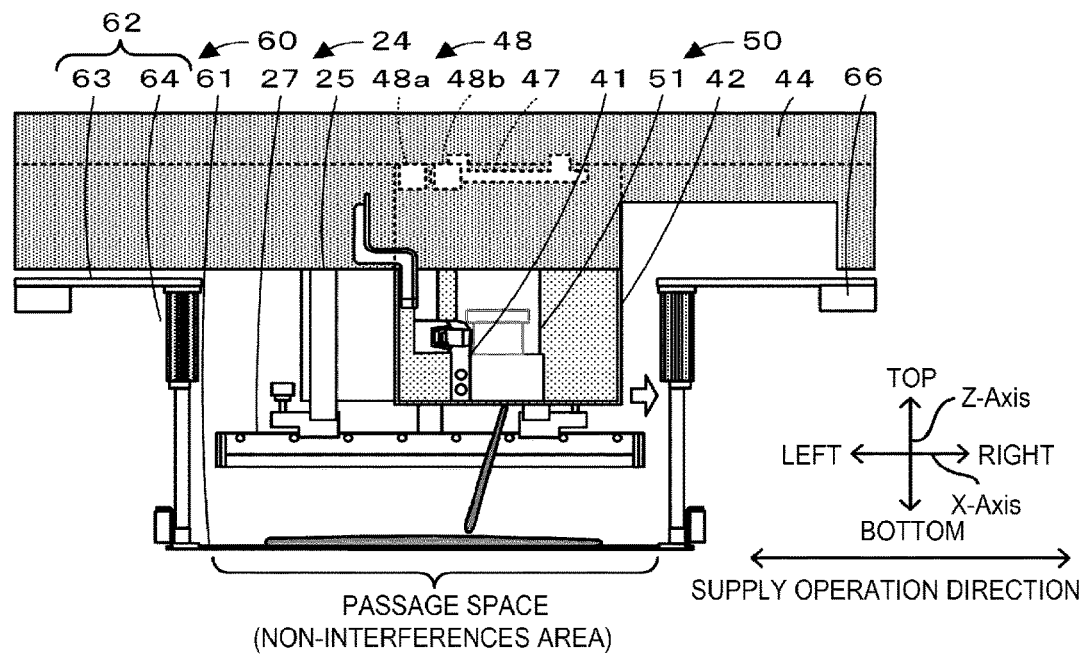

On the other hand, when supply section detecting section 48 detects detection member 47 in S 210, CPU 21 moves supply unit 40 to a supply position where the viscous fluid (solder roll) is present (S250). When the solder roll is on screen mask M, this screen mask M becomes the supply position, whereas when the solder roll is on collection member 61, this collection member 61 becomes the supply position. Subsequently, when supply unit 40 reaches the supply position, CPU 21 moves supply section 50 in supply operation direction (S260), and pressurizes cartridge 51 to supply the viscous fluid onto viscous fluid (S270). Subsequently, CPU 21 determines whether the output signal from at least one of the detection sensors of supply section detecting section 48 is not inputted, that is, whether the end section of detection member 47 is detached from one detection sensor (S280). When the output signal from at least one of the detection sensors is no longer inputted, CPU 21 determines that the end section of detection member 47 deviates from one detection sensor, that is, supply section 50 reaches the end section side of the passage space, stops the continuation of the movement of supply section 50, changes the supply operation direction, and moves supply section 50 (S290). FIG. 11 is an explanatory view of the supply processing by supply section 50, in which FIG. 11A is a state in which only the output signal of detection sensor 48*a* is obtained while supply section 50 is moved to the left side, and in which FIG. 11B is a state in which only the output signal of detection sensor 48*b* is obtained while supply section 50 is moved to the right side. As illustrated in FIG. 11, CPU 21 can reciprocally move supply section 50 in the passage space configured not to interfere with collection section 60 based on the output signal from supply section detecting section 48. It should be noted that in this printing device 11, a predetermined margin is provided so that supply section 50 does not contact collection section 60 even if supply section 50 moves beyond the state in FIGS. 11A and 11B until the output signals from the two detection sensors are no longer obtained.

After S 290 or when the output signals from the two detection sensors remain acquired in S 280, CPU 21 determines whether the supply of the viscous fluid is completed (S 300). This determination can be made based on whether the viscous fluid has been supplied for a predetermined time period. Alternatively, this determination may be made by measuring the amount of viscous fluid on screen mask M. If the supply of the viscous fluid is not completed, CPU 21 executes the processing in step S260 and the subsequent steps. That is, CPU 21 executes processing for causing the viscous fluid to be discharged while causing supply section 50 to reciprocate in the passage space, based on the output signal of supply section detecting section 48, until the supply of the viscous fluid is completed. On the other hand, when the supply of the viscous fluid is completed in S 300, CPU 21 causes printing moving section 26 and driving section 43 to move supply section 50 of supply unit 40 to the standby position, to cancel the connection of connecting section 46 (S 310), and terminates this routine. It should be noted that also in S 310, CPU 21 restricts the movement of the supply section 50 in the supply operation direction so that the output signal is obtained from at least one detection sensor of supply section detecting section 48 in the interference area, terminates this restriction when supply unit 40 reaches the outside of the interference area, and causes supply section 50 to be skewed to the standby position.

Here, correspondence relationships between constituent elements of the present embodiment and constituent elements of the present disclosure will be clarified. Cartridge 51 of the present embodiment corresponds to a cartridge, mounting section 41 corresponds to a mounting section, supply section 50 corresponds to a supply section, driving section 43 corresponds to a driving section, detection member 47 corresponds to a detection member, and supply section detecting section 48 corresponds to a supply section detecting section. In addition, screen mask M corresponds to a screen mask, board S corresponds to a printing target, the solder paste corresponds to a viscous fluid, collection member 61 corresponds to a collection member, collecting moving section 62 corresponds to a collecting moving section, and collection section 60 corresponds to a collection section. In addition, unit housing 49 corresponds to a fixing member, control section 20 corresponds to a control section, printing head 25 corresponds to a printing head, and printing section 24 corresponds to a printing section. In the present embodiment, the supply unit according to the present disclosure and the control method of the printing device according to the present disclosure will be described with reference to the descriptions of printing device 11.

Supply unit 40 according to the present embodiment described above includes supply section 50 having mounting section 41 capable of mounting and dismounting cartridge 51 configured to accommodate the solder paste as the viscous fluid, driving section 43 configured to move supply section 50 in the supply operation direction, detection member 47, and supply section detecting section 48 configured to detect whether supply section 50 is positioned in the passage space where collection section 60 and supply section 50 do not contact each other based on the position of detection member 47. In supply unit 40, since supply section 50 can be operated in the passage space configured not to physically interfere with each other when collection section 60 is operated, it is possible to prevent interference between the members of collection section 60 and supply section 50. Detection member 47 is formed to have a length L in the supply operation direction so that supply section 50 moves in a range in which supply section 50 does not contact collection section 60. In supply unit 40, since interference with collection section 60 can be prevented by driving supply section 50 in a range in which the detection signal from supply section detecting section 48 is output, interference between the members can be easily prevented by the shape of detection member 47. Further, detection member 47 is disposed in supply section 50 that moves in the supply operation direction, and supply section detecting section 48 is disposed in unit housing 49 as a fixing member configured not to move in the supply operation direction. Since supply section detecting section 48 is connected to an output line or a power supply line for outputting a signal, it is preferable that supply section detecting section 48 is disposed in unit housing 49 in terms of wiring.

In addition, control section 20 controls driving section 43 so that supply section detecting section 48 is placed in a state to detect detection member 47 in the interference area where collection section 60 and supply section 50 physically interfere with each other, and moves supply section 50 in the supply operation direction in the passage space. In this supply unit 40, it is possible to prevent interference between members under the control of control section 20. Further, supply section detecting section 48 is configured by multiple detection sensors, and control section 20 controls driving section 43 so as to move supply section 50 in the supply operation direction in the passage space in a state in which all of the detection sensors detect detection member 47, and controls driving section 43 so as to stop the continuation of the movement of supply section 50 when at least one of the detection sensors of supply section detecting section 48 is in a state in which detection member 47 is not sensed. In this supply unit 40, by using supply section detecting section 48 having multiple detection sensors, it is possible to perform more reliable control and to perform finer control. Furthermore, when at least one of the detection sensors of supply section detecting section 48 is in a state in which detection member 47 is not sensed, driving section 43 is controlled to change the movement direction of supply section 50 based on the position of supply section detecting section 48 at which detection member 47 is not sensed. In this supply unit 40, the movement control of supply section 50 including the movement direction of supply section 50 can be conducted using multiple detection sensors 48a and 48b. For example, although it is conceivable that the movement control of supply section 50 is performed using the linear encoder of driving section 43, it is preferable to directly detect supply section 50 using supply section detecting section 48 because more reliable control can be performed.

In addition, in a state in which supply section detecting section 48 has not sensed detection member 47, control section 20 controls driving section 43 so that supply section detecting section 48 moves supply member 50 in the direction in which detection member 47 is sensed. In this supply unit 40, it is possible to more reliably prevent the members from interfering with each other. Further, control section 20 moves supply section 50 in the direction in which supply section detecting section 48 detects detection member 47 by using the positional information of supply section 50 of the linear encoder. In this supply unit 40, supply section 50 can be moved in a more reliable direction by using the positional information of supply section 50. Furthermore, printing moving section 26 moves printing head 25 having squeegee 27 for performing the printing process and supply unit 40. In this printing device 11, since the moving section of supply unit 40 also serves as the moving section of printing head 25, the configuration can be further simplified.

It should be noted that the supply unit, the printing device, and the control method of the printing device of the present disclosure are not limited to any of the above embodiments, and may be implemented in various manners as long as they fall within the technical scope of the present disclosure.

For example, in the above embodiment, detection member 47 is formed to have a length L in the supply operation direction so that supply section 50 moves within a range in which supply section 50 does not contact collection section 60, but is not particularly limited to this. The shape or the like of detection member 47 may be particularly arbitrary as long as it can detect whether the supply section 50 is positioned in the passage space where collection section 60 and supply section 50 do not contact each other. In the above embodiment, although one detection member 47 is used, two or more detection members may be used as long as it is possible to detect whether the supply section 50 is positioned in the passage space where collection section 60 and supply section 50 do not contact each other.

In the above embodiment, detection member 47 is disposed in supply section 50 configured to move in the supply operation direction, and supply section detecting section 48 is disposed in unit housing 49 configured not to move in the supply operation direction, but the present disclosure is not particularly limited to this as long as it is possible to detect whether supply section 50 is positioned in the passage space where collection section 60 and supply section 50 do not contact each other. For example, supply section detecting section 48 may be disposed in supply section 50 configured to move in the supply operation direction, and detection member 47 may be disposed in unit housing 49 configured not to move in the supply operation direction. It should be noted that supply section detecting section 48 is preferably disposed on a fixing member configured not to move in the supply operation direction for convenience of wiring.

In the above embodiment, supply section detecting section 48 has two detection sensors 48a and 48b, but the present disclosure is not particularly limited thereto, and may have three or more detection sensors. Supply section detecting section 48 may include one detection sensor. In a case where supply section detecting section 48 has one detection sensor, it is impossible to detect the movement direction of supply section 50 or even to obtain a detection margin section 50, but it is possible to detect whether supply section 50 is in the passage space. In the above embodiment, detection member 47 is disposed at the center of supply section 50 and supply section detecting section 48 is disposed above the center of collection member 61 (the passing space), but may be disposed at a position other than the center of each section as long as it is possible to detect that supply section 50 is present in the passing space.

In the above embodiment, after acquiring the output signal from both of detection sensors 48a and 48b, when one of the output signals is lost, control section 20 stops the continuation of the movement of supply section 50 to change the movement direction. However, the present disclosure is not particularly limited thereto, and after the output signal from one of detection sensors 48a and 48b is lost, control section 20 may stop the continuation of the movement of supply section 50 to change the movement direction when the output signal from both of detection sensors 48a and 48b is lost. Also in this supply unit 40, it is possible to prevent interference between collection section 60 and supply section 50 using detection member 47 and supply section detecting section 48.

In the above embodiment, control section 20 has caused supply section 50 to skew until supply unit 40 reaches the interference area, but the present disclosure is not particularly limited to this, and, for example, supply section 50 may be moved in the supply operation direction, supply section detecting section 48 may detect detection member 47, and then detection member 47 may be moved in the printing direction by print moving section 26. In this supply unit 40, although it takes a long movement time, it is possible to more reliably prevent the interference between supply section 50 and collection section 60.

In the above embodiment, printing moving section 26 moves printing section 24 and supply unit 40, but the present disclosure is not particularly limited thereto, and supply unit 40 may be moved by a moving section different from printing moving section 26. Even in this printing device, although the number of moving sections increases, it is possible to prevent the interference between collection section 60 and supply section 50. In the above embodiment, driving section 43 moves supply section 50 including restricting wall section 42 in the supply operation direction, however, the present disclosure is not particularly limited thereto, and the movement of restricting wall section 42 may be omitted, or restricting wall section 42 itself may be omitted. In supply unit 40, when restricting wall section 42 is not present in supply section 50, it is possible to further secure the movement distance in the supply operation direction of cartridge 51.

In the above embodiment, collection section 60 includes the two collection members 61 of collection sections 60a and 60b, but the present disclosure is not particularly limited thereto, and may include only one collection member 61. If there is at least one collection member 61, it is possible to collect the viscous fluid at the time of exchanging screen mask M, perform one-way printing, or the like.

In the above embodiment, the present disclosure has been described as printing device 11 including supply unit 40, but the present disclosure is not particularly limited to this, and may be limited to only supply unit 40 or may be a control method of printing device 11.

The supply unit, the printing device, and the control method of the printing device according to the present disclosure may be configured as follows. For example, in a supply unit of the present disclosure, the detection member may be formed to have a length in the supply operation direction so that the supply section moves within a range in which the supply section does not contact the collection section. In this supply unit, since the supply section may be driven in a range in which the detection signal from the supply section detecting section is output, it is possible to easily prevent interference between the members depending on the shape of the detection member.

In the supply unit of the present disclosure, the detection member may be disposed in the supply section configured to move in the supply operation direction, the supply section detecting section may be disposed in a fixing member configured not to move in the supply operation direction, or the detection member may be disposed in a fixing member configured not to move in the supply operation direction, and the supply detecting section may be disposed in the supply section configured to move in the supply operation direction. It should be noted that it is preferable that the supply section detecting section is disposed on the fixing member in view of the relationship in which the output line or the power supply line for outputting the signal is connected to the supply section detecting section.

The supply unit of the present disclosure may include a control section configured to control the driving section so that the supply section detecting section is in a state to detect the detection member in an interference area where the collection section and the supply section physically interfere with each other, and move the supply section in the supply operation direction in the passage space. In this supply unit, interference between members can be prevented by control of the control section.

In the supply unit of the present disclosure including a control section, multiple number of the supply section detecting section may be disposed, the control section may control the driving section to move the supply section in the supply operation direction in the passage space in a state in which all of the supply section detecting sections detect the detection member, and may control the driving section to stop continuing movement of the supply in a state in which at least one of multiple member of the supply section detecting sections does not detect the detection member. In this supply unit, by using multiple supply section detecting sections, more reliable control can be performed, and finer control can be performed. Alternatively, the control section may control the driving section to move the supply section in the supply operation direction in the passage space in a state in which all of the multiple supply section detecting sections detect the detection member, and may control the driving section to change the movement direction of the supply section based on the position of the supply section detecting section that has not detected the detection member in a state in which at least one of the supply section detecting sections does not detect the detection member.

In the supply unit of the present disclosure including a control section, the control section may control the driving section to move the supply section in a direction in which the supply section detecting section detects the detection member in a state in which the supply section detecting section has not detected the detection member. In this supply unit, it is possible to more reliably prevent the members from interfering with each other. In the supply unit, the control section may move the supply section in a direction in which the supply section detecting section detects the detection member using positional information of the supply section.

The printing device of the present disclosure includes: a printing head configured to perform printing process of a viscous fluid to a printing target using a screen mask;
- a collection section having a collection member configured to contact the screen mask to collect and move the viscous fluid and a collecting moving section configured to move the collection member in a predetermined printing direction;
- a supply unit as described anywhere above;
- a supply moving section configured to move the supply unit between a standby area in which the supply unit is placed in standby and a supply area in which the viscous fluid is supplied; and
- a control section configured to control the driving section so that the supply section moves in the supply operation direction in the passage space in a state in which the supply section detecting section detects the detection member in an interference area where the collection section and the supply section in the supply area physically interfere with each other and to control the supply moving section so that the supply unit moves in the interference area.

In this printing device, since the supply unit described above is provided, it is possible to prevent interference between members of the collection section and the supply section. In addition, the printing device can obtain an effect according to any of the adopted modes of the above described supply units.

In the printing device according to the present disclosure, the supply moving section may be a printing head having a squeegee configured to move the viscous fluid on a screen mask to execute the printing process. In this printing device, since the supply moving section of the supply unit also serves as the printing head, the configuration can be further simplified.

The control method of a printing device according to the present disclosure comprises:
- a printing head configured to perform printing process of a viscous fluid to a printing target using a screen mask;
- a collection section having a collection member configured to contact the screen mask to collect and move the viscous fluid and a collecting moving section configured to move the collection member in a predetermined printing direction;
- a supply unit having a supply section having a mounting section capable of mounting and dismounting a cartridge accommodating the viscous fluid;
- a driving section configured to move the supply section in a supply operation direction;
- a detection member;
- a supply section detecting section configured to detect whether the supply section is positioned in the passage space in which the collection section and the supply section do not contact each other by the position of the detection member; and
- a supply moving section configured to move the supply unit between a standby area in which the supply unit is placed in standby and a supply area in which the viscous fluid is supplied, and the control method including the steps of:
- controlling the driving section so that the supply section detecting section is in the state to detect the detection member in an interference area in which the collection section and the supply section in the supply area physically interfere with each other;

moving the supply section in the supply movement direction within the passage space; and
controlling the supply movement section so that the supply unit moves within the supply area.

The control method of the printing device can prevent interference between members of the collection section and the supply section, similarly to the supply unit and the printing device described above. In the control method of the printing device, various modes of the supply unit and the printing device described above may be employed, or steps for realizing the functions of the supply unit and the printing device described above may be added.

INDUSTRIAL APPLICABILITY

The present disclosure can be used in the technical field of a device for printing a viscous fluid on a printing target.

REFERENCE SIGNS LIST 10 mounting system, 11 printing device, 12 mounting device, 14 main body, 16 door member, 20 control section, 21 CPU, 23 engagement member, 24 printing section, 25 printing head, 26 print moving section, 27 squeegee, 28 mask section, 29 mask fixing section, 30 board processing section, 31 board conveyance section, 32 cleaning section, 33 cleaning member, 35 imaging section, 36 camera, 40 supply unit, 41 mounting section, 42 restricting wall section, 43 driving section, 44 cover member, 45 fixing mechanism, 46 connection section, 47 detection member, 48 supply section detecting section, 48a, 48b detection sensor, 49 unit housing, 50 supply section, 51 cartridge, 52 accommodation container, 60 60a 60b collection section, 61 collection member, 62 collection moving section, 63 support member, 64 lifting and lowering section, 65 driving section, 66 guide, 90 management PC, M screen mask, S Board

The invention claimed is:

1. A supply unit used in a printing device, comprising:
a printing head configured to perform printing process of a viscous fluid using a screen mask to a printing target;
a squeegee configured to push the viscous fluid on the screen mask;
a collection section including a collection member configured to contact the screen mask to collect and move the viscous fluid remaining on the screen mask from the squeegee and a collecting moving section configured to move the collection member in a predetermined printing direction, wherein the supply unit supplies the viscous fluid;
a supply section including a mounting section capable of mounting and dismounting a cartridge accommodating the viscous fluid;
a driving section configured to move the supply section in a supply operation direction;
a detection member; and
a supply section detecting section configured to detect whether the supply section is positioned in a passage space where the collection section and the supply section do not contact each other based on a position of the detection member.

2. The supply unit according to claim 1, wherein the detection member is formed to have a length in the supply operation direction so that the supply section moves in a range in which the supply section does not contact the collection section.

3. The supply unit according to claim 1, wherein the detection member is disposed, in the supply section configured to move in the supply operation direction and the supply section detecting section is disposed in a fixing member configured not to move in the supply operation direction, or the detection member is disposed in a fixing member configured not to move in the supply operation direction and the supply section detecting section is disposed in the supply section configured to move in the supply operation direction.

4. The supply unit according to claim 1, comprising a control section configured to control the driving section so that the supply section detecting section is in a state to detect the detection member in an interference area where the collection section and the supply section physically interfere with each other, and to move the supply section in the supply operation direction in the passage space.

5. The supply unit according to claim 4, wherein multiple number of the supply section detecting sections are disposed, and the control section controls the driving section to move the supply section in the supply operation direction in the passage space in a state in which all of the supply section detecting sections detect the detection member and controls the driving section to stop the continuation of movement of the supply section in a state in which at least one of the multiple number of the supply section detecting sections does not detect the detection member.

6. The supply unit according to claim 4, wherein the control section controls the driving section to move the supply section in a direction in which the supply section detecting section detects the detection member in a state in which the supply section detecting section does not detect the detection member.

7. A printing device comprising: the supply unit according to claim 1; a supply moving section configured to move the supply unit between a standby area in which the supply unit stands by and a supply area in which the viscous fluid is supplied; and a control section configured to control the driving section so that the supply section moves in the supply operation direction in the passage space in a state in which the supply section detecting section detects the detection member in an interference area where the collection section and the supply section in the supply area physically interfere with each other, and to control the supply moving section so that the supply unit moves in the interference area.

8. The supply unit according to claim 1, wherein the collecting moving section moves the collection member independently from the supply section.

9. A control method for a printing device comprising:
a printing head configured to perform printing process of a viscous fluid to a printing target using a screen mask;
a squeegee configured to push the viscous fluid on the screen mask;
a collection section having a collection member configured to contact the screen mask to collect and move the viscous fluid remaining on the screen mask from the squeegee and a collecting moving section configured to move the collection member in a predetermined printing direction;
a supply unit having a supply section having a mounting section capable of mounting and dismounting a cartridge accommodating the viscous fluid; a driving section configured to move the supply section in a supply operation direction; a detection member; a supply section detecting section configured to detect whether the supply section is positioned in a passage space where the collection section and the supply section do not contact each other by a position of the detection member; and
a supply moving section configured to move the supply unit between a standby area in which the supply unit stands by and a supply area in which the viscous fluid is supplied; and the control method including the steps of:
controlling the driving section so that the supply section detecting section is in a state to detect the detection member in an interference area in which the collection section and the supply section in the supply area physically interfere with each other;
moving the supply section in the supply operation direction within the passage space; and
controlling the supply moving section so that the supply unit moves within the supply area.

* * * * *